United States Patent [19]
Phong

[11] Patent Number: 5,770,547
[45] Date of Patent: Jun. 23, 1998

[54] PROCESS FOR MAKING CUO SUPERCONDUCTORS

[75] Inventor: Linh Ngo Phong, Ste Foy, Canada

[73] Assignee: Her Majesty the Queen in right of Canada, as represented by the Minister of National Defence of Her Majesty's Canadian Government, Ontario, Canada

[21] Appl. No.: 823,115

[22] Filed: Mar. 25, 1997

Related U.S. Application Data

[63] Continuation of Ser. No. 452,489, May 30, 1995, abandoned, which is a continuation of Ser. No. 98,000, Jul. 29, 1993, abandoned.

[30] Foreign Application Priority Data

Jul. 29, 1992 [CA] Canada .................................. 2074896

[51] Int. Cl.$^6$ .......................... H01L 39/24; C04B 40/00; B29C 71/00
[52] U.S. Cl. .......................... 505/501; 264/82; 264/234; 264/235
[58] Field of Search .................................. 505/500, 501, 505/330, 475, 476, 412; 264/82, 234, 235, 237, 346

[56] References Cited

U.S. PATENT DOCUMENTS

| | | | |
|---|---|---|---|
| 4,916,115 | 4/1990 | Mantese et al. | 505/1 |
| 4,952,556 | 8/1990 | Mantese et al. | 505/1 |
| 4,957,900 | 9/1990 | Yamazaki | 505/1 |
| 4,962,088 | 10/1990 | Micheli et al. | 505/1 |
| 4,983,577 | 1/1991 | Mantese et al. | 505/1 |
| 5,110,791 | 5/1992 | Ri | 505/1 |

OTHER PUBLICATIONS

"Fabrication of Bi(Pb)SrCaCuO Thin–Film of High–Tc Phase" by T. Yotsuya et al in *Japanese Journal of Applied Physics*, 1989 (Jun.) vol. 28, No. 6, pp. L972–L974.

*Primary Examiner*—Christopher A. Fiorilla
*Attorney, Agent, or Firm*—Larson & Taylor

[57] ABSTRACT

A process for making a superconducting, Pb-doped, 2:2:2:3 BiSrCaCuO thin film includes heating deposited thin film material at between 1083K and 1103K for no more than 20 minutes in oxygen with a flow rate of 500 sccm, followed by quenching the material in air to room temperature, heating the material in air between 1103K and 1143K for no more than 40 minutes and finally quenching the material in air to room temperature.

28 Claims, No Drawings

PROCESS FOR MAKING CUO SUPERCONDUCTORS

This application is a continuation of application Ser. No. 08/452,489, filed May 30, 1995 now abandoned, which is a continuation of application Ser. No. 08/098,000, filed Jul. 29, 1993, now abandoned.

BACKGROUND OF THE INVENTION

1. Field of the Invention

This invention pertains to making superconductors. In particular, this invention pertains to a two-stage crystallization process for fast, reproducible fabrication of superconducting Pb-doped BiSrCaCuO thin films having a critical temperature (hereinafter "$T_c$") of 106K.

2. Description of Related Prior Art

BiSrCaCuO is one of the recently discovered CuO superconductors, such as YBaCuO and TlBaCaCuO, having Tc greater than 77K. For certain application of thin films of such material, it is preferable that the $T_c$ of the film is above 100K. To achieve that result (i) their cation ratios should correspond to those of the highest-$T_c$ superconducting phase i.e. Bi:Sr:Ca:Cu=2:2:2:3 and (ii) they have been doped with Pb which enhances formation of the highest-$T_c$ superconducting phase.

Thin film Pb-doped BiSrCaCuO superconductors fabricated in-situ have exhibited $T_c$ much lower than 100K. Typical prior art ex-situ thin film fabrication is described in "Fabrication of Bi(Pb)SrCaCuO Thin-Film of High-$T_c$ Phase" by T. Yotsuya et al in the *Japanese Journal of Applied Physics* 1989 (June) volume 28, number 6 at pages L972 to L974. Prior art ex-situ fabrication has resulted in thin films with a $T_c$ above 100K by depositing (Pb)BiSrCaCuO thin film in amorphous phase and then applying a single step heat treatment lasting between 16 and 50 hours to react the constituents and form the desired crystal structure. Heat treatments of that type have included heating the thin film at between 1123K and 1153K in air or oxygen and then slowly cooling it to room temperature.

For three reasons it is desirable to reduce the heat treatment time. Firstly, decreasing the amount of time it takes to produce the product increases the commercial and industrial attractiveness of producing the product. Secondly, product quality depends upon the temperatures to which the thin films are exposed and the times for which they are exposed to such temperatures. Conventional heat treatment has required the heating equipment to provide thermal stability at a specific temperature in the range of 1123K to 1153K over relatively long periods, which has been difficult to obtain. Shorter heat treatment times can offer greater product reproducibility. Thirdly, Pb evaporates during heat treatment and the evaporation of Pb during heat treatment is one reason why the $T_c$ range of conventionally heat treated thin films is usually 80K to 90K (i.e. low $T_c$ phase). Since Pb enhances the formulation of the highest $T_c$ superconducting phase, decreasing the heat treatment time can result in less Pb being evaporated and hence in high $T_c$ being enhanced.

SUMMARY OF THE INVENTION

Accordingly, the present invention provides, in a crystallization process for obtaining the highest $T_c$ phase in multiphase PbBiSrCaCuO superconductors, the steps comprising (i) heating PbBiSrCaCuO film material in an oxygen-rich atmosphere, (ii) cooling material resulting from step "i" to room temperature the material resulting from step "i", (iii) heating material resulting from step "ii" in air and (iv) cooling material resulting from step "iii" to room temperature the material resulting from step "iii".

DESCRIPTION OF PREFERRED EMBODIMENTS

In a preferred embodiment, the superconductor material comprises thin-film Pb-doped BiSrCaCuO. The constituents of the layout to prepare such a thin film by single target sputtering are as set out in Table I, wherein j is the specific constituent, $n_j$ is the number of moles needed with respect to the nominal composition Pb:Bi:Sr:Ca:Cu=2:2:2:2:3 of the oxide target, $u_j$ is the molecular weight, $M_{jtheo}$ is the theoretical stoichiometric weight, $M_{jactual}$ is the actual stoichiometric weight and $T_m$ is the melting temperature.

TABLE I

Stoichiometric weights and melting points of the powder compounds required for a 35 g $(Pb_2)Bi_2Sr_2Ca_2Cu_3O_y$ superconductive target

| j | $n_j$ | $\mu_j$ (g/mol) | $M_{jtheo.}$ (g) | $M_{jactual}$ (g) | $T_m^1$ (°C.) |
|---|---|---|---|---|---|
| PbO | 2 | 223.19 | 9.4894 | 9.4890 | 886 |
| $Bi_2O_3$ | 1 | 465.96 | 9.9056 | 9.9059 | 860 |
| $SrCO_3$ | 2 | 147.63 | 6.2768 | 6.2773 | $1497^2$ |
| $CaCO_3$ | 2 | 100.09 | 4.2555 | 4.2556 | 899 |
| CuO | 3 | 79.54 | 5.0727 | 5.0726 | 1326 |
| Total | | | 35.0000 | 35.0004 | |

[1] At 1 atm
[2] At 69 atm

EXAMPLE 1

The thin film material was deposited on a target by single-target RF magnetron sputtering at 8.5 cm from a source as measured along the discharge axis. The deposition parameters are as set out in Table II. (In Table II, and in this specification in general, "sccm" means "standard cubic centimetre per minute".)

TABLE II

Experimental values of the parameters of the thin-film deposition

| Sputtering target | Composition | $(Pb)Bi_2Sr_2Ca_2Cu_3O_y$ |
|---|---|---|
| | Diameter | 5 cm |
| | Bias voltage | −250 V |
| Substrate type I | Composition | (100) MgO single crystal |
| | Dimension | 10 mm × 3 mm × 0.5 mm |
| | Temperature | Ambient |
| Substrate type II | Composition | Corning glass no. 2947 |
| | Dimension | 76 mm × 25 mm × 1 mm |
| | Temperature | Ambient |
| Target-substrate distance | | $(8.5^2 + d^2)^{1/2}$ cm $0 \leq d \leq 5$ |
| Sputtering gas | Composition | High-purity argon |
| | Flow rate | 9 sccm |
| Pressure | Base pressure | $10^{-6}$ Torr |
| | Sputtering pressure | $4 \times 10^{-3}$ Torr |
| Sputtering frequency | | 13.56 MHz |
| Presputtering | RF power | 100 W |
| | Deposition time | 15 min |
| Sputtering | RF power | 80 W |
| | Deposition time | 30–260 min |

The characteristics of different zones of thin films are as set out in Table III, the zones being specified by radial distance from the discharge axis.

TABLE III

Characteristics of different zones of the deposited films

| Zone | A | B | C |
| --- | --- | --- | --- |
| Radial distance | 0–1.5 cm | 1.5–2.5 cm | 2.5–4.5 cm |
| Thickness profile | U-shaped | level | linear |
| Longitudinal thickness variation[1] | up to 60% | ≦3% | ≦3% |
| Lateral thickness variation[1] | ~9–12% | ~1.5% | ~9–12% |
| Optical density | high | medium | low |
| Deposition rate |  | ~112–118 Å/min | ~87–110 Å/min |
| Nominal composition[2] | Bi-deficient | Bi-deficient | 2223 |

[1]120-minute deposited film
[2]Film thickness ≧ 1 μm

For three reasons the Zone C (Table III) thin film material is preferred. Firstly, the nominal composition of the metallic elements therein is Pb:Bi:Sr:Ca:Cu=1.3:2:2:2:3, which is in the preferred range of 1.2:2:2:2:3 to 1.4:2.4:2.4:2:3. Secondly, it is compositionally homogeneous, which aids in uniform heat distribution during annealing. Thirdly, it is uniformly 1 micrometer thick, which is in the preferred range from 0.3 micrometers to 1.5 micrometers.

Zone C material is heated in an oven in the range from 1083K to 1103K, preferably between 1093K and 1103K, in an oxygen-rich atmosphere for 20 minutes. (As used in this specification, "oxygen-rich atmosphere" includes an atmosphere of pure oxygen, and in this preferred embodiment the oxygen-rich atmosphere is pure oxygen.) That atmosphere is achieved by an oxygen flow rate in the range from 400 to 600 sccm, preferably 500 sccm.

The resulting material is then quenched to room temperature in 20% to 35% relative humidity room temperature air, by removing the material from the oven directly to the room temperature air. (As used in this specification the expression "room temperature" means approximately 300K and includes the range 293K to 303K.)

Next, the material is heated in air in the range from 1103K to 1143K, preferably between 1128K and 1143K, for forty minutes. This second heating is at a pressure slightly above atmospheric pressure. The pressure difference is to avoid a liquid-state reaction that might otherwise occur. The reaction might otherwise occur because the temperature range for the heating is approximately 10K to 30K lower than the melting temperature of (Pb)BiSrCaCuO at atmospheric pressure.

Finally, the material is again quenched in air to room temperature.

The material finally produced by this process has nearly the highest value of $T_c$ that can be reached for that material, and is substantially of a single phase with small grain size and virtually no microcracks or large voids.

Although preferred embodiments of the present invention have been described herein, it will be understood by those skilled in the art that the present invention is not restricted thereto but may instead be varied within the scope of the following claims without departing from the spirit of the invention. For example, in applying this invention to bulk or thick film superconductors of Pb-doped or undoped BiSrCaCuO the heat treatment times may be longer. Specifically, the duration of the crystallization process of bulk samples is usually at least twice that required for thin films. Similarly, quenching does not have to be the way in which the thin film material is cooled to room temperature, but not quenching the material greatly increases the processing time.

The embodiments of the invention in which an exclusive property or privilege is claimed are defined as follows:

1. A crystallization process for obtaining the highest $T_c$ phase in PbBiSrCaCuO superconductors, said highest $T_c$ phase having a cation ratio of Bi:Sr:Ca:Cu=2:2:2:3, the steps comprising:
   (i) heating PbBiSrCaCuO material film in an oxygen-rich atmosphere,
   (ii) cooling the material resulting from step "i" to room temperature,
   (iii) heating the material resulting from step "ii" in air,
   (iv) cooling the material resulting from step "iii" to room temperature,
   wherein the total heating time of steps (i) and (iii) is from 60 to about 120 minutes.

2. A process as claimed in claim 1, wherein said film is in the range from 0.3 micrometers to 1.5 micrometer thick.

3. A process as claimed in claim 2, wherein said film is 1 micrometer thick.

4. A process as claimed in claim 1, wherein the nominal composition of Pb:Bi:Sr:Ca:Cu of said film is in the range of Pb:Bi:Sr:Ca:Cu=1.2:2:2:2:3 to 1.4:2.4:2.4:2:3.

5. A process as claimed in claim 4, wherein said nominal composition is Pb:Bi:Sr:Ca:Cu=1.3:2:2:2:3.

6. A process as claimed in claim 5, wherein said heating in an oxygen-rich atmosphere is in the range from 1083K to 1103K.

7. A process as claimed in claim 6, wherein said heating in an oxygen-rich atmosphere is in the range from 1093K to 1103K.

8. A process as claimed in claim 6, wherein said heating in an oxygen-rich atmosphere is for 20 minutes.

9. A process as claimed in claim 4, wherein said oxygen-rich atmosphere is achieved by an oxygen flow rate in the range from 400 to 600 sccm.

10. A process as claimed in claim 4, wherein said cooling to room temperature in either step "ii" or step "iv" is achieved by quenching said superconductor material.

11. A process as claimed in claim 10, wherein said quenching is in room temperature air.

12. A process as claimed in claim 11, wherein the relative humidity of said air is in the range from 20% to 35%.

13. A process as claimed in claim 11, wherein said heating in air is in the range from 10K to 30K above the melting temperature of said film and is at a pressure sufficiently above atmospheric pressure to avoid a liquid-state reaction between said film and said air.

14. A process as claimed in claim 4, wherein said heating in air is in the range from 10K to 30K above the melting temperature of said film and is at a pressure sufficiently above atmospheric pressure to avoid a liquid-state reaction between said film and said air.

15. A process as claimed in claim 14, wherein said heating in air is in the range from 1103K to 1143K.

16. A process as claimed in claim 15, wherein said heating in air is in the range from 1128K to 1143K.

17. A process as claimed in claim 15, wherein said heating in air is for forty minutes.

18. A process as claimed in claim 1, wherein said oxygen-rich atmosphere is achieved by an oxygen flow rate in the range from 400 to 600 sccm.

19. A process as claimed in claim 18, wherein said cooling to room temperature in either step "ii" or step "iv" is achieved by quenching said superconductor material.

20. A process as claimed in claim 18, wherein said heating in air is in the range from 10K to 30K above the melting temperature of said film and is at a pressure sufficiently above atmospheric pressure to avoid a liquid-state reaction between said film and said air.

21. A process as claimed in claim 1, wherein said cooling to room temperature in either step "ii" or step "iv" is achieved by quenching said superconductor material.

22. A process as claimed in claim 21, wherein said quenching is in room temperature air.

23. A process as claimed in claim 22, wherein the relative humidity of said air is in the range from 20% to 35%.

24. A process as claimed in claim 21, wherein said heating in air is in the range from 10K to 30K above the melting temperature of said film and is at a pressure sufficiently above atmospheric pressure to avoid a liquid-state reaction between said film and said air.

25. A process as claimed in claim 1, wherein said heating in air is in the range from 10K to 30K above the melting temperature of said film at atmospheric pressure and is at a pressure sufficiently above atmospheric pressure to avoid a liquid-state reaction between said film and said air.

26. A process as claimed in claim 25, wherein said heating in air is in the range from 1103K to 1143K.

27. A process as claimed in claim 26, wherein said heating in air is in the range from 1128K to 1143K.

28. A process as claimed in claim 26, wherein said heating in air is for forty minutes.

* * * * *